US011757254B2

(12) United States Patent
Fuchs et al.

(10) Patent No.: US 11,757,254 B2
(45) Date of Patent: Sep. 12, 2023

(54) OPTOELECTRONIC SEMICONDUCTOR DEVICE AND METHOD OF MANUFACTURING AN OPTOELECTRONIC SEMICONDUCTOR DEVICE

(71) Applicant: OSRAM Opto Semiconductors GmbH, Regensburg (DE)

(72) Inventors: Peter Fuchs, Regensburg (DE); Ann Russell, San Jose, CA (US); Thomas Falck, Sunnyvale, CA (US); Hubert Halbritter, Dietfurt-Toeging (DE); Bruno Jentzsch, Regensburg (DE); Christian Lauer, Pettendorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 180 days.

(21) Appl. No.: 16/989,028

(22) Filed: Aug. 10, 2020

(65) Prior Publication Data

US 2021/0218229 A1    Jul. 15, 2021

Related U.S. Application Data

(60) Provisional application No. 62/960,858, filed on Jan. 14, 2020.

(51) Int. Cl.
*H01S 5/18*       (2021.01)
*H01S 5/183*      (2006.01)
(Continued)

(52) U.S. Cl.
CPC ...... *H01S 5/18361* (2013.01); *H01S 3/10061* (2013.01); *H01S 5/0281* (2013.01); *H01S 5/18397* (2013.01)

(58) Field of Classification Search
CPC .......... H01S 5/40–4093; H01S 5/3095; H01S 5/42–426; H01S 5/18; H01S 5/185; H01S 5/187

See application file for complete search history.

(56) References Cited

U.S. PATENT DOCUMENTS

| 4,760,578 A | 7/1988 | Oshima et al. |
| 2002/0051474 A1 * | 5/2002 | Choa .................. H01S 5/187 372/45.01 |

(Continued)

FOREIGN PATENT DOCUMENTS

| WO | WO-2021180461 A1 * | 9/2021 | ............. H01S 5/026 |
| WO | WO-2021214172 A1 * | 10/2021 | ............... H01S 5/18 |

(Continued)

OTHER PUBLICATIONS

International Search Report and Written Opinion in corresponding International Application No. PCT/EP2021/050722 dated Jul. 1, 2021, 24 pages.

*Primary Examiner* — Xinning (Tom) Niu
*Assistant Examiner* — Delma R Fordé
(74) *Attorney, Agent, or Firm* — MH2 TECHNOLOGY LAW GROUP LLP

(57) ABSTRACT

An optoelectronic semiconductor device comprises a plurality of laser devices. Each of the laser devices is configured to emit electromagnetic radiation. The laser devices are horizontally arranged. A first laser device of the plurality of laser devices is configured to emit electromagnetic radiation having a first wavelength different from the wavelength of a further laser device of the plurality of laser devices. A difference between the first wavelength and the wavelength of the further laser device is less than 20 nm.

6 Claims, 18 Drawing Sheets

(51) Int. Cl.
*H01S 3/10* (2006.01)
*H01S 5/028* (2006.01)

(56) References Cited

U.S. PATENT DOCUMENTS

| | | |
|---|---|---|
| 2005/0083982 A1* | 4/2005 | Behfar ................ H01S 5/0264 |
| | | 372/50.1 |
| 2009/0097519 A1 | 4/2009 | Brick et al. |
| 2010/0316076 A1 | 12/2010 | Behfar et al. |
| 2013/0194787 A1 | 8/2013 | Geske et al. |
| 2017/0331257 A1 | 11/2017 | Eichler et al. |

FOREIGN PATENT DOCUMENTS

| | | | |
|---|---|---|---|
| WO | WO-2021214174 A1 * | 10/2021 | |
| WO | WO-2021239407 A1 * | 12/2021 | ............... H01S 5/18 |

* cited by examiner

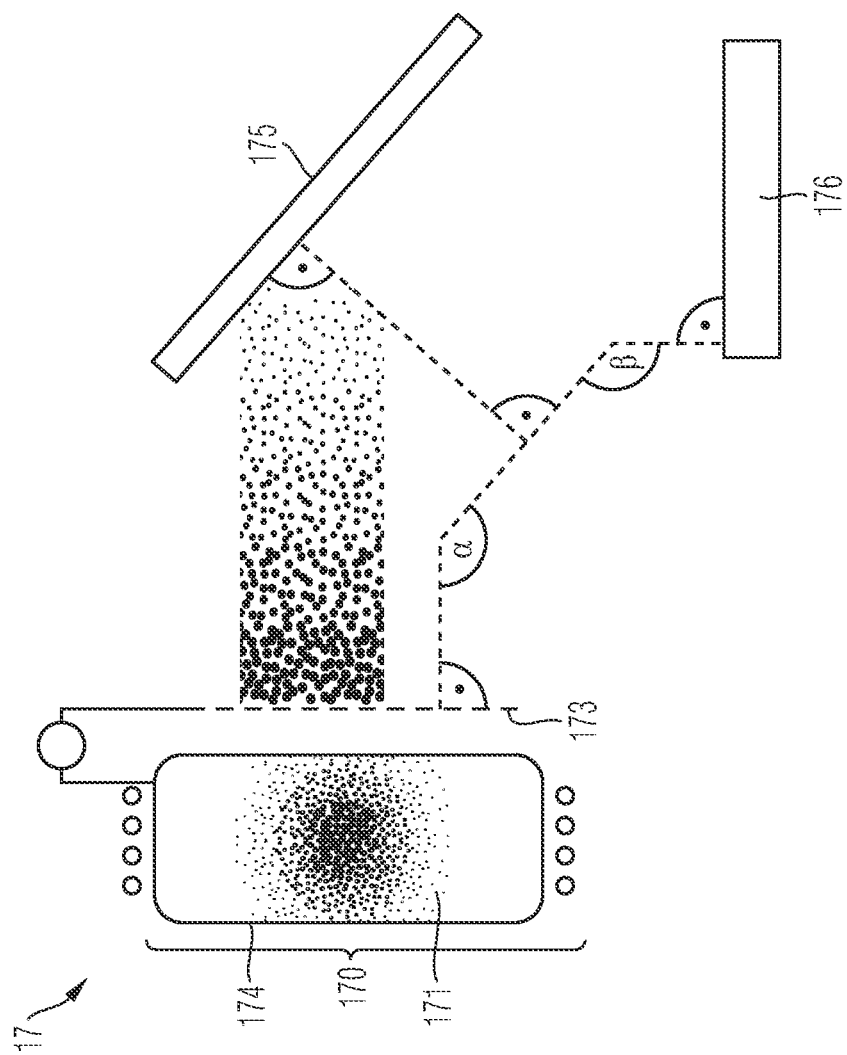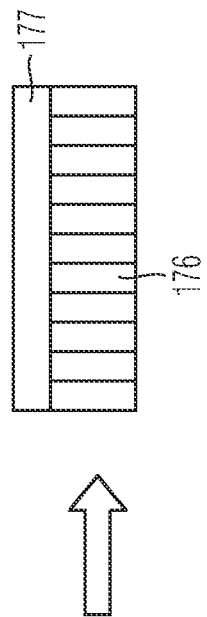

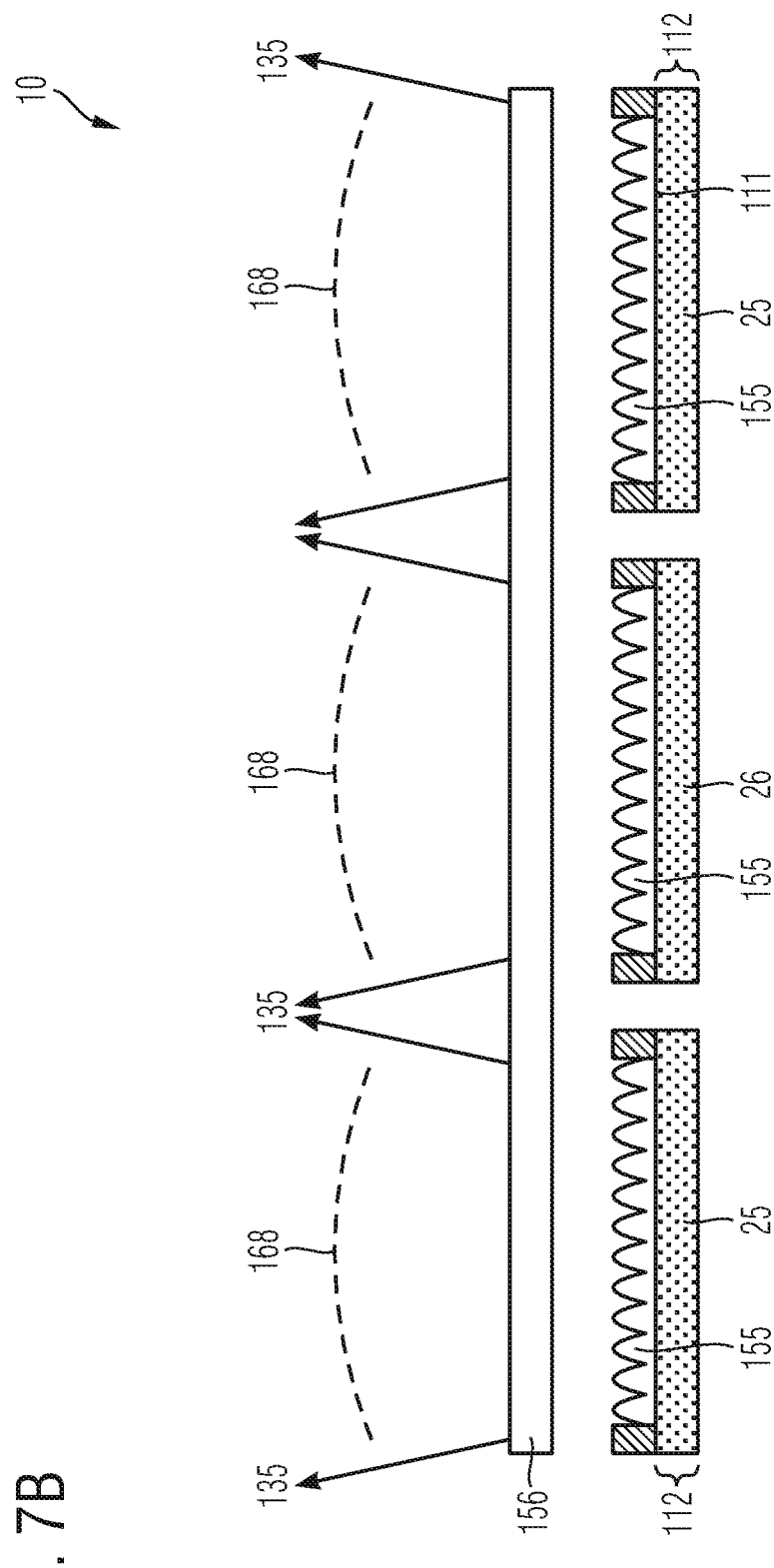

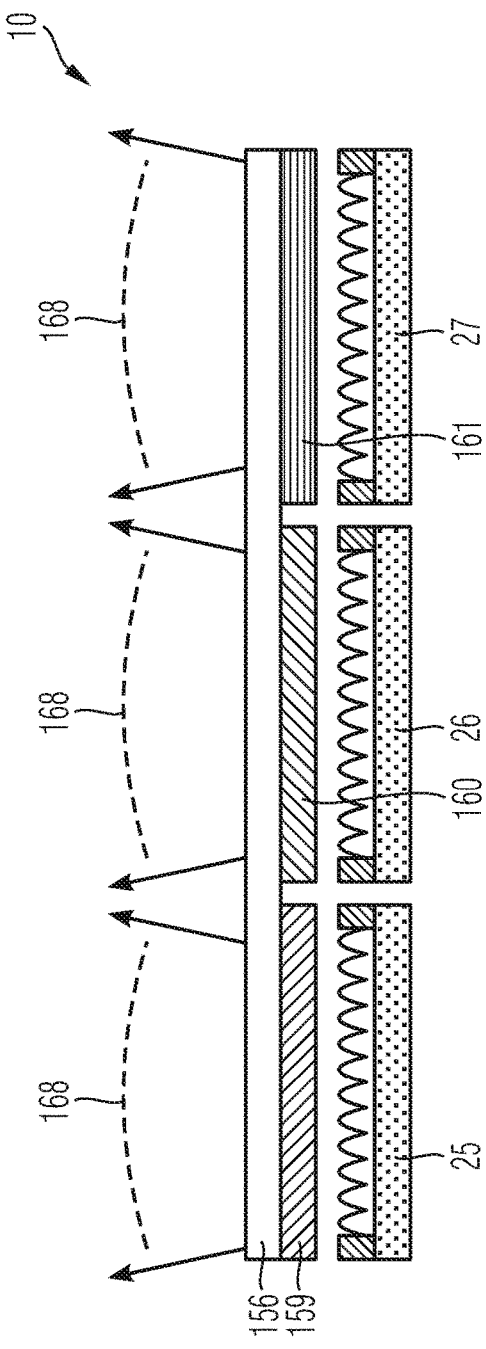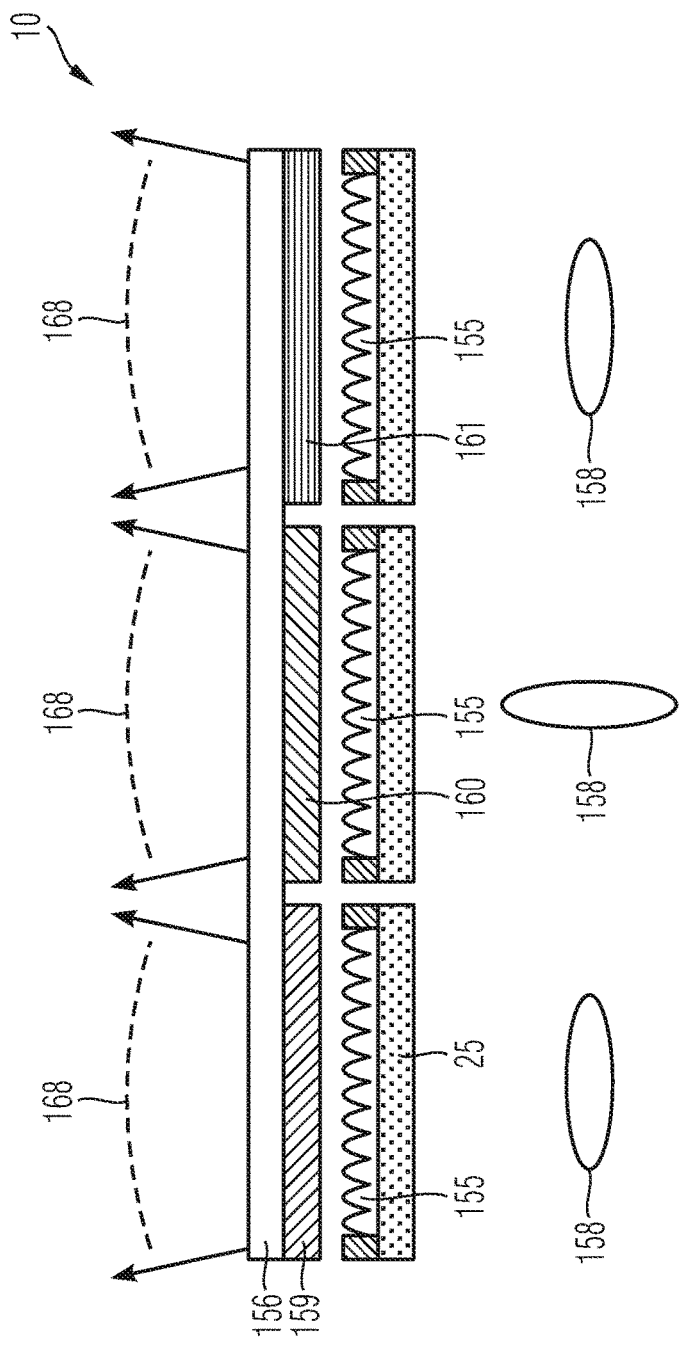

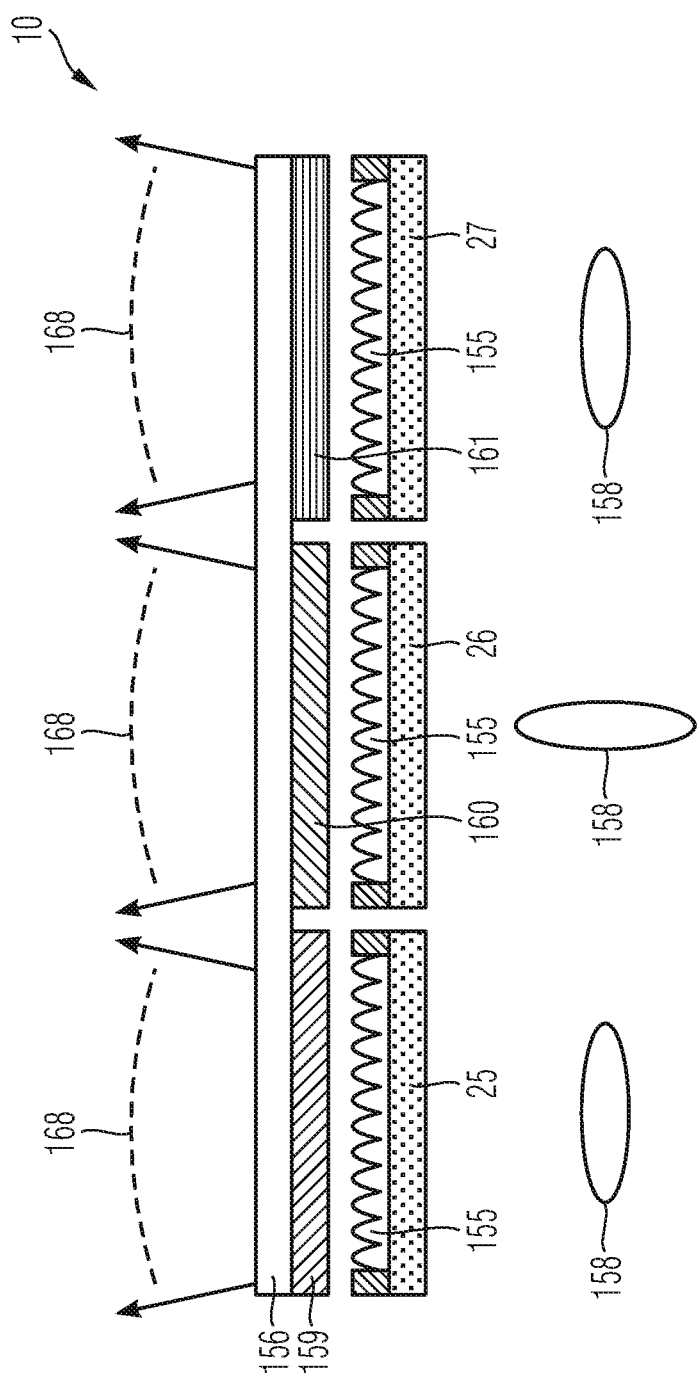

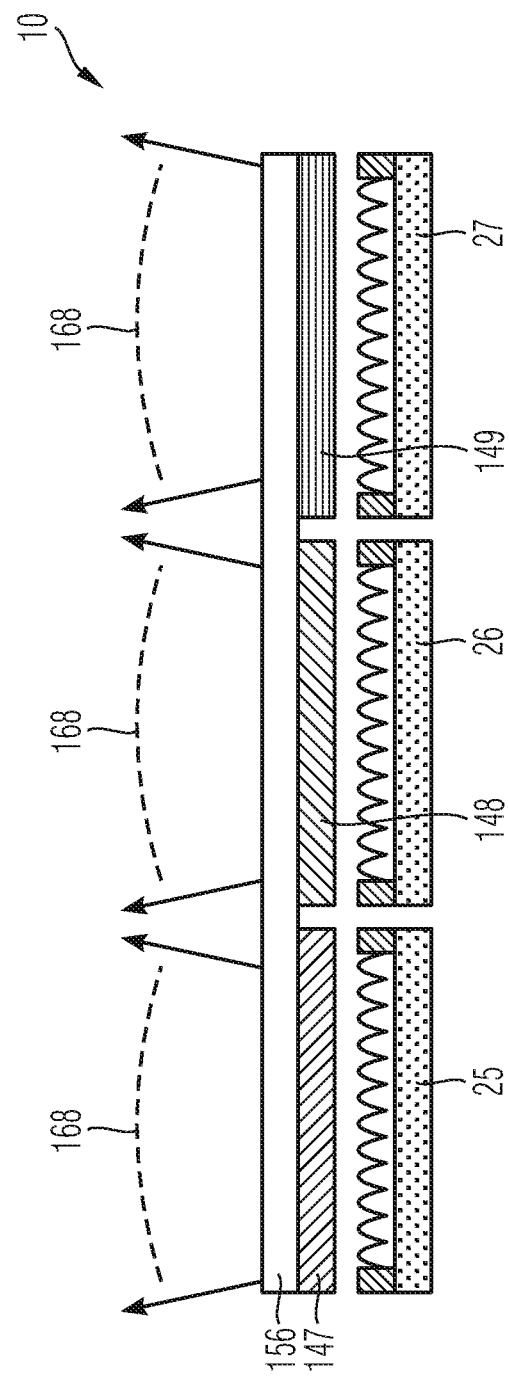

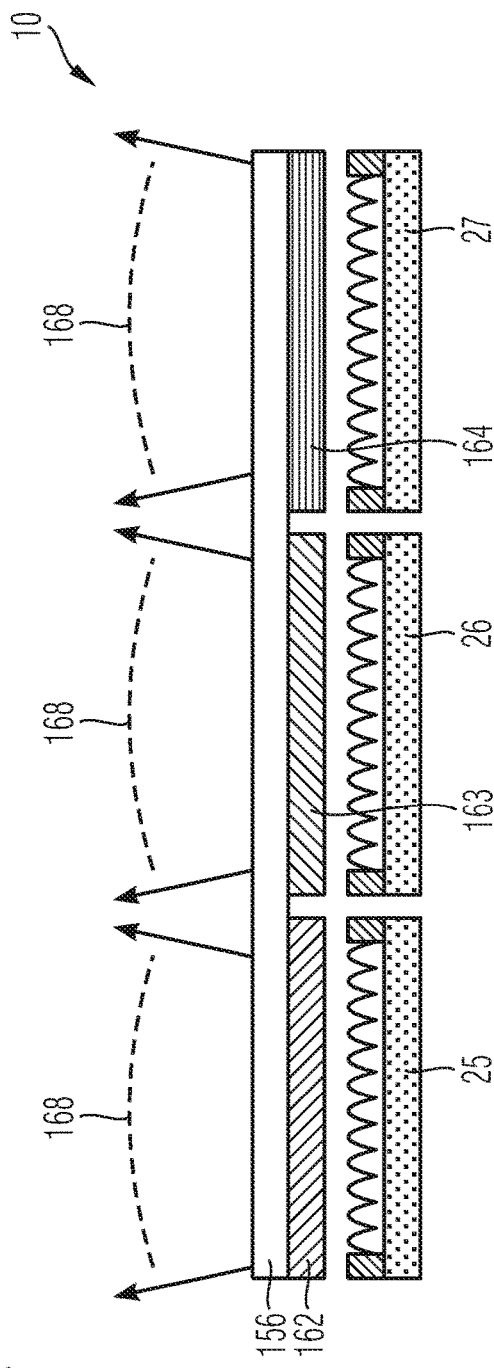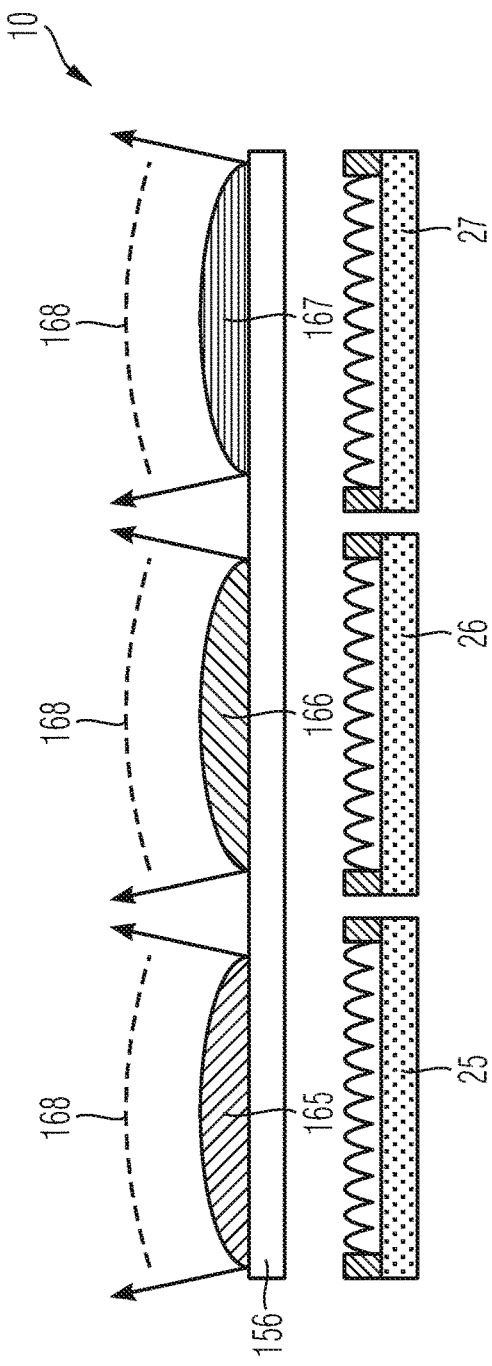

OPTOELECTRONIC SEMICONDUCTOR DEVICE AND METHOD OF MANUFACTURING AN OPTOELECTRONIC SEMICONDUCTOR DEVICE

CROSS REFERENCE TO RELATED APPLICATIONS

This application claims the benefit of U.S. Provisional Patent Application No. 62/960,858 filed on Jan. 14, 2020, the entire contents of which is hereby incorporated by reference in its entirety.

FIELD OF THE DISCLOSURE

Embodiments relate to an optoelectronic semiconductor device comprising a plurality of laser devices.

BACKGROUND

Semiconductor laser devices are used in various illumination applications. Due to the fact that the emitted laser light is highly coherent, problems of speckles may occur.

SUMMARY

Various arrangements of laser devices are discussed herein to address speckle issues, filtering issues and how to improve the packaging of laser devices.

As will be discussed in the following, an optoelectronic semiconductor device comprises a plurality of laser devices, each of the laser devices being configured to emit electromagnetic radiation, the laser devices being horizontally arranged. A first laser device of the plurality of laser devices is configured to emit electromagnetic radiation having a first wavelength different from the wavelength of a further laser device of the plurality of laser devices. A difference between the first wavelength and the wavelength of the further laser device is less than 20 nm.

According to further embodiments, an optoelectronic semiconductor device comprises a plurality of laser devices, each of the laser devices being configured to emit electromagnetic radiation via a first main surface of a semiconductor layer stack. The plurality of laser devices are horizontally arranged. A first laser device of the plurality of laser devices is configured to emit electromagnetic radiation having a polarization state different from the polarization state of a further laser device of the plurality of laser devices.

According to further embodiments, an optoelectronic semiconductor device comprises a semiconductor chip comprising an array of laser devices. Each of the laser devices is configured to emit electromagnetic radiation. The laser devices are horizontally arranged. Each of the laser devices comprises a first cavity mirror, a second cavity mirror and an optical resonator between the first cavity mirror and the second cavity mirror. An active zone for generating electromagnetic radiation is arranged in the optical resonator. The first cavity mirrors of each of the laser devices are different from each other.

A method of manufacturing an optoelectronic semiconductor device comprises forming a layer stack comprising a plurality of semiconductor layers for forming a plurality of laser devices being horizontally arranged. A first laser device of the plurality of laser devices is configured to emit electromagnetic radiation having a first wavelength different from the wavelength of a further laser device of the plurality of laser devices. A difference between the first wavelength and the wavelength of the further laser device is less than 20 nm.

According to further embodiments, a method of manufacturing an optoelectronic semiconductor device comprises forming a layer stack comprising a plurality of semiconductor layers for forming a plurality of vertical cavity surface emitting laser devices being horizontally arranged. The method further comprises forming a birefringent plate over the plurality of vertical cavity surface emitting laser devices. A thickness of the birefringent plate over a first vertical cavity surface emitting laser device is different from the thickness of the birefringent plate over a further laser device of the vertical cavity surface emitting laser devices.

According to embodiments, an illumination or imaging device comprises the optoelectronic semiconductor device as explained above.

According to further embodiments, a projection device or an augmented reality device comprises the optoelectronic semiconductor device as discussed above.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 6A shows a schematic view of a sputtering apparatus according to embodiments.

FIG. 6B shows a view of a wafer comprising a plurality of laser devices.

FIG. 7B shows a vertical cross-sectional view of an optoelectronic semiconductor device according to embodiments.

FIGS. 8A and 8B show vertical cross-sectional views of an optoelectronic semiconductor device according to embodiments.

FIGS. 9A and 9B show vertical cross-sectional views of an optoelectronic semiconductor device according to further embodiments.

FIG. 10 shows a vertical cross-sectional view of an optoelectronic semiconductor device according to embodiments.

FIGS. 11A and 11B show vertical cross-sectional views of an optoelectronic semiconductor device according to further embodiments.

DETAILED DESCRIPTION

Figure 1:
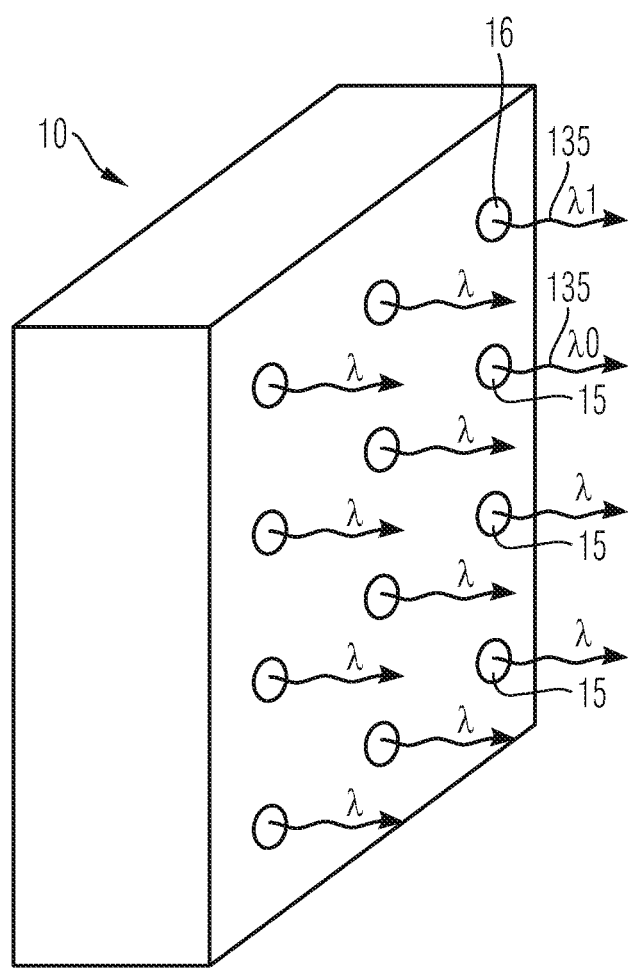
FIG. 1 shows a perspective view of an optoelectronic semiconductor device according to embodiments.

In the following detailed description reference is made to the accompanying drawings, which form a part hereof and in which are illustrated by way of illustration specific embodiments in which the invention may be practiced. In this regard, directional terminology such as "top", "bottom", "front", "back", "over", "on", "above", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer" or "semiconductor substrate" used in the following description may include any semiconductor-based structure that has a semiconductor surface. Wafer and structure are to be understood to include doped and undoped semiconductors, epitaxial semiconductor layers, e.g. supported by a base semiconductor foundation, other semiconductor structures or an insulating substrate. For example, a layer of a first semiconductor material may be grown on a growth substrate of a second semiconductor material. According to further embodiments, the growth substrate may be an insulating substrate such as a sapphire substrate. Depending on the purpose of use, the semiconductor may be based on a direct or an indirect semiconductor material. Examples of semiconductor materials particularly suitable for generation of electromagnetic radiation comprise nitride-compound semiconductors, by which e.g. ultraviolet or blue light or longer wavelength light may be generated, such as GaN, InGaN, AlN, AlGaN, AlGaInN, phosphide-compound semiconductors, by which e.g. green or longer wavelength light may be generated such as GaAsP, AlGaInP, GaP, AlGaP, as well as further semiconductor materials including AlGaAs, SiC, ZnSe, GaAs, ZnO, Ga2O3, diamond, hexagonal BN and combinations of these materials. Further examples of semiconductor materials may as well be silicon, silicon-germanium and germanium. The stoichiometric ratio of the compound semiconductor materials may vary. In the context of the present specification, the term "semiconductor" further encompasses organic semiconductor materials.

The term "substrate" is intended to encompass insulating or semiconductor materials.

The terms "lateral" and "horizontal" as used in this specification intends to describe an orientation parallel to a first surface of a substrate or semiconductor body. This can be for instance the surface of a wafer or a die.

The term "arranged horizontally" as used within the present disclosure is intended to mean that the respective components may be arranged horizontally spaced apart. For example the components arranged horizontally may be arranged in one layer.

According to embodiments it is intended that the respective components do not vertically overlap. For example, the components that are arranged horizontally may be formed from the same layer(s).

The term "vertical" as used in this specification intends to describe an orientation which is arranged perpendicular to the first surface of a substrate or semiconductor body. The term "vertical" may correspond to a growth direction of grown semiconductor layers.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The term "electrically connected" further comprises tunneling contacts between connected elements.

FIG. 1 shows a perspective view of an optoelectronic semiconductor device 10 according to embodiments. As will be discussed in the following, the optoelectronic semiconductor device comprises a plurality of laser devices 15, 16. Each of the laser devices 15, 16 is configured to emit electromagnetic radiation 135. A first laser device 16 of the plurality of laser devices is configured to emit electromagnetic radiation 135 having a first wavelength $\lambda_1$ which is different from the wavelength $\lambda_0$ of a further laser device 15 of the plurality of laser devices. A difference between the first wavelength $\lambda_1$ and the wavelength $\lambda_0$ of the further laser device 15 is less than 20 nm. According to further embodiments, the difference between the first wavelength $\lambda_1$ and the wavelength $\lambda_0$ of the further laser device 15 may be less than 10 nm. For example, the difference between the first wavelength $\lambda_1$ and the wavelength $\lambda_0$ of the further laser device 15 may be larger than 3 nm.

The plurality of laser devices may be implemented in an arbitrary manner, as will be discussed in the following. For example, the laser devices may be surface emitting lasers in which electromagnetic radiation 135 is emitted perpendicularly with respect to a surface of a semiconductor layer stack. According to further embodiments, the plurality of laser devices may be implemented as edge emitting lasers which emit the electromagnetic radiation via a sidewall of the semiconductor layers.

Figure 2A:
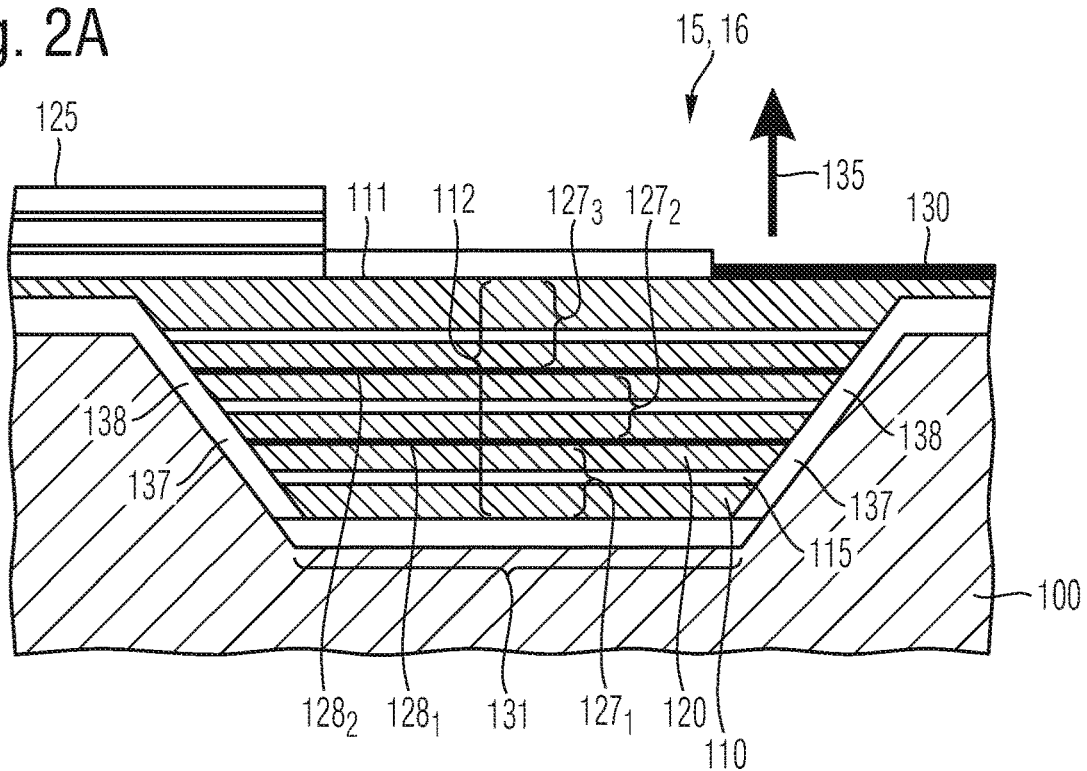
FIGS. 2A and 2B show cross-sectional views of a laser device that may form a component of the optoelectronic semiconductor device.
Figure 2B:
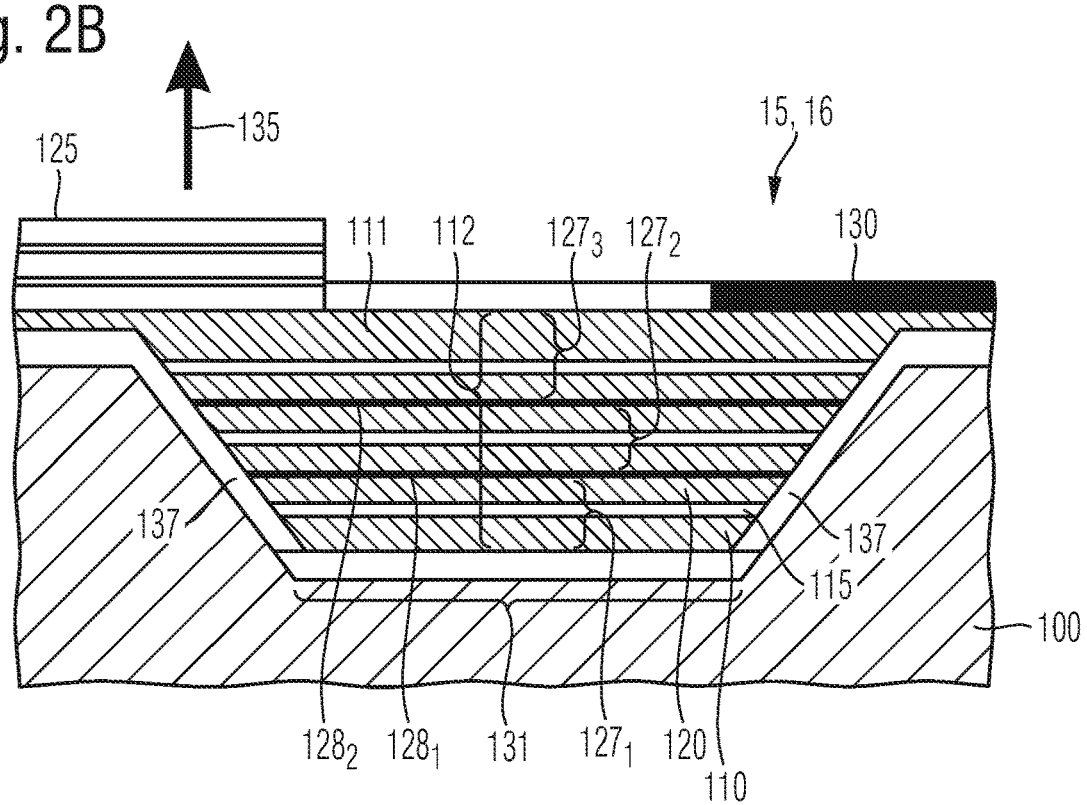

FIG. 2A shows a vertical cross-sectional view of a laser device 15, 16 that may form part of the optoelectronic semiconductor device. The laser device 15, 16 comprises a semiconductor layer stack 112. The semiconductor layer stack 112 includes an active zone 115 for generating electromagnetic radiation. The laser device 15, 16 further comprises a first cavity mirror 125, a second cavity mirror 130 and an optical resonator 131. The optical resonator 131 is arranged between the first cavity mirror 125 and the second cavity mirror 130. According to embodiments that are illustrated in FIGS. 2A and 2B, the optical resonator 131 extends in a direction parallel to a first main surface 111 of the semiconductor layer stack 112. The first cavity mirror 125 has a wavelength dependent reflectivity. The second cavity mirror 130, may, for example, have a lower reflectivity than the first cavity mirror 125. The second cavity mirror 130 may as well have a wavelength dependent reflectivity. The generated electromagnetic radiation 135 may be outcoupled via the second cavity mirror 130.

The semiconductor layer stack 112 comprises a first semiconductor layer 110 of a first conductivity type, for example, p-type, and a second semiconductor layer 120 of a second conductivity type, for example, n-type. Electric contact elements may be provided for applying a voltage to the laser device 15, 16.

The semiconductor layer stack 112 may be epitaxially grown over an appropriate growth substrate. An active zone 115 may be arranged between the first and second semiconductor layers 110, 120. The active zone 115 may comprise, for example, a pn-junction, a double heterostructure, a single quantum well structure (SQW) or a multi quantum well structure (MQW) for generating electromagnetic radiation. The term "quantum well structure" does not impose any restriction as regards to a dimensionality of the quantization. This term is intended to encompass inter alia quantum wells, quantum wires and quantum dots as well as any combination of these elements.

The active zone 115 may be implemented by a layer or layer sequence having a main surface that is parallel to an extension direction of the optical resonator 131. The lateral surfaces of the semiconductor layer stack 112 are etched at an angle of about 45°. A dielectric layer 138 may be arranged adjacent to the obliquely etched side surfaces. According to further embodiments a dielectric carrier substrate 100 may be arranged directly adjacent to the obliquely etched side surfaces. Due to the difference of refractive index between the semiconductor material of the semiconductor layer stack 112 and the dielectric layer 138, total reflection will occur at the side surface of the semiconductor layers. As a result, the oblique side surfaces of the semiconductor layer stack 112 implement reflecting sidewalls 137. The first and the second cavity mirror 125, 130 are arranged over the first main surface 111 of the semiconductor layer stack 112. The carrier substrate 100 generally may be insulating or may comprise a semiconductor material.

The generated electromagnetic radiation is reflected by the first cavity mirror 125 and the second cavity mirror 130 into the semiconductor layer stack 112 comprising the active zone 115.

As is further shown in FIG. 2A, several laser elements $127_1$, $127_2$ and $127_3$ are stacked over each other in a vertical direction. The laser elements $127_1$, $127_2$ and $127_3$ are connected by means of connecting layers $128_1$, $128_2$. The connecting layers $128_1$, $128_2$ may be implemented by tunnel junctions so that an electrical connection is enabled. As is clearly to be understood more than three laser elements may be stacked over each other. The laser elements $127_1$, $127_2$ and $127_3$ may be vertically overlapping.

Generally, within the present disclosure, the term "tunnel junction" is intended to mean a sequence of very heavily doped semiconductor layers of a first and a second conductivity type. For example, a first heavily doped layer of a first conductivity type may be arranged adjacent to and in contact with the first semiconductor layer 110 of the first conductivity type of a laser element $127_1$, $127_2$, $127_3$. Moreover, a second heavily doped layer of a second conductivity type may be arranged adjacent to and in contact with the second semiconductor layer 120 of the second conductivity type of the laser element $127_1$, $127_2$, $127_3$. Optionally, further intermediate layers may be arranged between the heavily doped layers. The sequence of very heavily doped layers of the first and second conductivity type as well as optionally the intermediate layers implement a tunnel diode. Using the tunnel diode, the respective laser elements $127_1$, $127_2$ and $127_3$ may be connected in series.

For example, a material of the first and the second semiconductor layer 110, 120 as well as of the active zone 115 may be based on the AlGaAs or GaAs material system and may comprise AlGaAs or GaAs semiconductor layers. In this case, the connecting layers $128_1$, $128_2$ may comprise a tunnel junction that may comprise AlGaAs: Te/C. For example, the tunnel junction may comprise Te-doped or C-doped AlGaAs or Te-doped or C-doped GaAs. The tunnel junction may be arranged at a position of a node of a standing wave that is formed in the layer stack. As a result, the absorbance of electromagnetic radiation by the tunnel junction may be reduced.

According to further embodiments, the laser device disclosed herein may be based on the InAlGaAsP or the InAlGaN material system.

According to embodiments that are shown in FIG. 2B, the first cavity mirror 125 may have a smaller reflectivity than the second cavity mirror 130. The generated electromagnetic radiation 135 may be emitted via the first main surface 111 at the position of the first cavity mirror 125. Further components of the laser device 15, 16 illustrated in FIG. 2B are similar to those that have been explained with reference to FIG. 2A.

According to embodiments, the first cavity mirror 125 having a wavelength dependent reflectivity may be implemented by a Bragg mirror. The Bragg mirror may comprise a plurality of thin dielectric or semiconductor layers.

Generally, the term "Bragg mirror" is intended to mean any arrangement which reflects incoming electromagnetic radiation and which comprises dielectric or semiconductor layers. The Bragg mirror may be composed of dielectric or semiconductor layers. According to further embodiments, the Bragg mirror may further comprise metal layers. By way of example, the Bragg mirror may be formed of a sequence of very thin dielectric or semiconductor layers having different refractive indices. A mixture of dielectric and semiconductor layers is possible. For example, layers of a high refractive index (for example, larger than 1.7) and a lower refractive index (for example n<1.7) may be alternately stacked. A Bragg mirror may, for example, comprise up to fifty dielectric or semiconductor layers. A typical layer thickness of the single layers may be approximately 30 to 90 nm, for example about 50 nm. The layer stack may further comprise one or two or more layers having a thickness larger than 180 nm, for example larger than 200 nm. In addition, the layer stack may further comprise layers having a thickness less than 30 nm.

According to further embodiments, the layers of the Bragg mirror may be implemented by epitaxially grown semiconductor layers, optionally further comprising metal layers.

Materials of a cavity mirror having a wavelength dependent reflectivity may for example comprise AlO, TaO, SiO, TiO, AlN, SiN, Si, NbO, ITO, ZnO, Ag and Al and further semiconductor materials such as InAlGaAsP, InAlGaN and ZnSe. The sequence, composition and layer thickness of the respective layers is selected so that a desired reflectivity may be implemented.

According to embodiments, also the second cavity mirror 130 may be implemented as a Bragg mirror. Composition, sequence and layer thickness of the single layers of the second cavity mirror 130 may be selected so that also the second cavity mirror has a wavelength dependent reflectivity. According to further embodiments, composition, sequence and layer thickness of the single layers of the second cavity mirror may be selected so that the second cavity mirror does not have a wavelength dependent reflectivity.

According to embodiments, the first cavity mirror 125, may be implemented as a Bragg mirror and may comprise at least one epitaxially grown semiconductor layer. The epitaxially grown semiconductor layer may be configured to absorb electromagnetic radiation of a wavelength which is smaller than an intended target wavelength $\lambda_t$ of the laser device. The semiconductor layer may thus be an absorbing layer. Using such a semiconductor layer, a steep sidewall of the reflectivity on a side of smaller wavelength may be implemented.

Figure 2C:
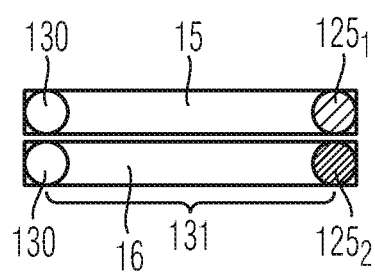
FIGS. 2C to 2E show schematic configurations of laser devices.
Figure 2D:
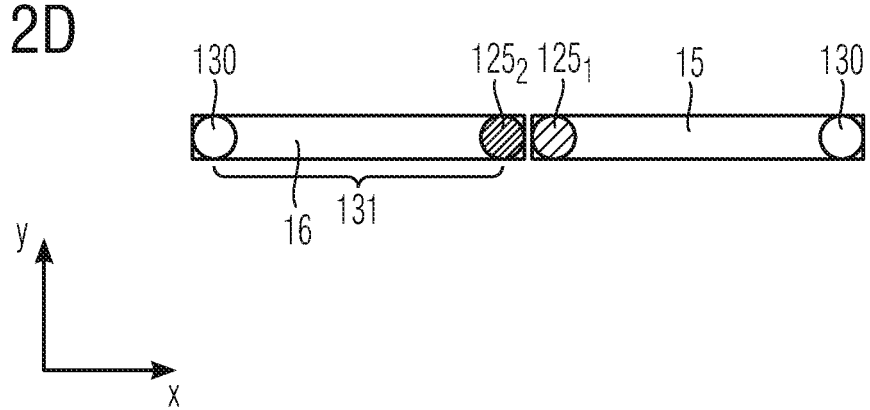
Figure 2E:
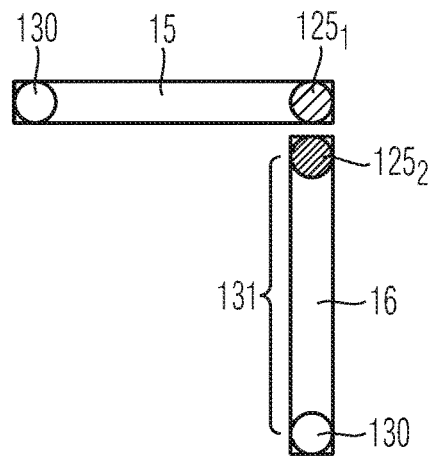

FIGS. 2C to 2E show possible arrangements of laser devices 15, 16 according to embodiments. For example, as is shown in FIG. 2C, the laser device 15 and the first laser device 16 may be arranged so that the first cavity mirrors $125_1$, $125_2$ are arranged in close spatial relationship. Further, the second cavity mirrors 130 are arranged in close spatial relationship. For example, the laser devices may be arranged along the y direction which is perpendicular to the direction of the laser cavity 131.

According to embodiments shown in FIG. 2D, the laser devices may be arranged along the x direction that corresponds to the extension direction of the laser cavity 131. The first cavity mirror $125_1$, $125_2$ may be arranged in close spatial relationship. The distance between the second cavity mirror 130 is larger than the distance between the first cavity mirrors $125_1$, $125_2$.

According to further embodiments that are illustrated in FIG. 2E, one of the laser devices 15 extends along the x direction, whereas the first laser device 16 extends in the y direction, i.e. perpendicularly with respect to the laser device 15. Again, the first cavity mirrors $125_1$, $125_2$ are arranged in close spatial relationship. When using the arrangement of FIG. 2E, the polarization direction of emitted electromagnetic radiation by the laser device 15 is rotated by 90° with respect to the polarization direction of electromagnetic radiation emitted by the first laser device 16.

According to embodiments, the first cavity mirror 125 is the mirror having the lower reflectivity. Accordingly, electromagnetic radiation may be emitted via the first cavity mirrors $125_1$, $125_2$. According to further embodiments, the first cavity mirror may as well have a higher reflectivity than the second cavity mirror. In this case, electromagnetic radiation may be emitted via the second cavity mirrors 130.

Figure 3A:
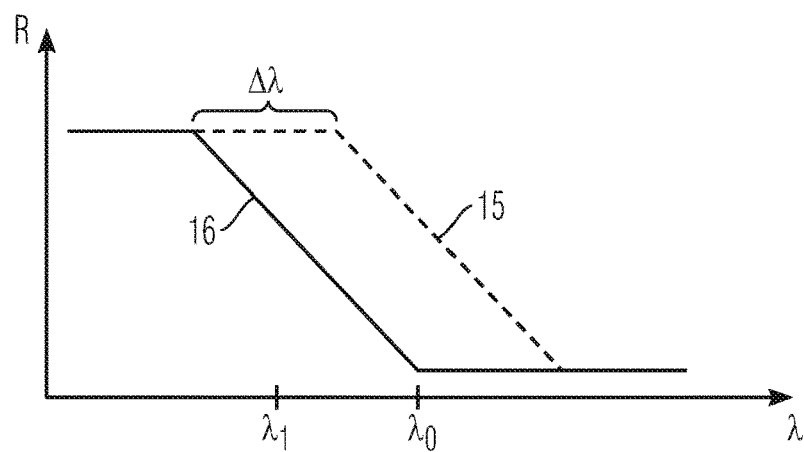
FIGS. 3A and 3B show the reflectivity of a cavity mirror in dependence of the wavelength.

FIG. 3A shows the reflectivity in dependence from the emitting wavelength $\lambda$ for the laser device 15 and the first laser device 16. The term "reflectivity" may refer to the reflectivity of the first cavity mirror of the laser devices 15, 16. In this case, the characteristic denoted by "15" refers to the reflectivity of the first cavity mirror $125_1$ of the laser device 15 and the characteristic denoted by "16" refers to the reflectivity of the first cavity mirror $125_2$ of the first laser device 16. Alternatively, the term "reflectivity" may refer to the combined reflectivities of the first and second cavity mirrors 125, 130. In this case, the reflectivity refers to the product of the reflectivity of the first cavity mirror 125 and the second cavity mirror 130. In this case, the characteristic denoted by "15" refers to the product of the reflectivity of the first cavity mirror $125_1$ of the laser device 15 and the reflectivity of the second cavity mirror 130. The characteristic denoted by "16" refers to the product of the reflectivity of the first cavity mirror $125_2$ of the first laser device 16 and the reflectivity of the second cavity mirror 130 of the first laser device 16.

As is shown, the reflectivity of the first laser device 16 is different from the reflectivity of the laser device 15. In particular, the wavelength dependent reflectivity is different. Accordingly, the wavelength dependent reflectivity decreases at a lower wavelength than the reflectivity of the laser device 15. As a result, the emission wavelength $\lambda_1$ of the first laser device 16 is slightly shifted with respect to the wavelength $\lambda_0$ of the laser device 15. For example, the difference $\Delta\lambda$ between the wavelength emitted by the laser device 15 and the first laser device 16 may be smaller than 20 nm, e.g. smaller than 10 nm. The difference $\Delta\lambda$ may be greater than 3 nm. As a result, the occurrence of speckles may be suppressed.

As is shown in FIG. 3A, the reflectivity decreases from a (local) maximum of the reflectivity. According to embodiments shown in FIG. 3B, the reflectivity may increase from a minimum to a maximum value and then again decreases. In this case, the emission wavelength of the respective laser device corresponds to the position where the reflectivity has its maximum.

Figure 3B:
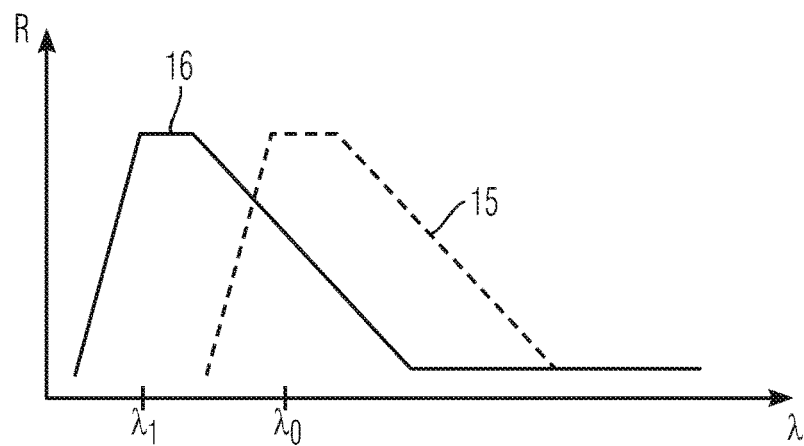

For example, as shown in FIG. 3B, the emission wavelength $\lambda_1$ of the first laser device 16 may correspond to the maximum of the reflectivity of the first laser device 16. Further, the emission wavelength $\lambda_0$ of the laser device 15 may correspond to the maximum of the reflectivity of the laser device 15. Here again, the term "reflectivity" may correspond to the reflectivity of the first cavity mirror $125_1$, $125_2$. Alternatively, the reflectivity may refer to the combined reflectivity, i.e. the product of the reflectivity of the second cavity mirror 130 and the first cavity mirror $125_1$, $125_2$.

As has been discussed, by providing a cavity mirror having a wavelength dependent reflectivity, laser devices of a laser array may be formed to have slightly detuned wavelengths. For example, the slightly detuned wavelength may be achieved without modifying the epitaxial layer sequence of the semiconductor layer stack. Instead, by changing the first cavity mirrors, e.g. by modifying the layer thicknesses and/or composition of the layers of the cavity mirrors, the wavelengths may be detuned.

Figure 4C:
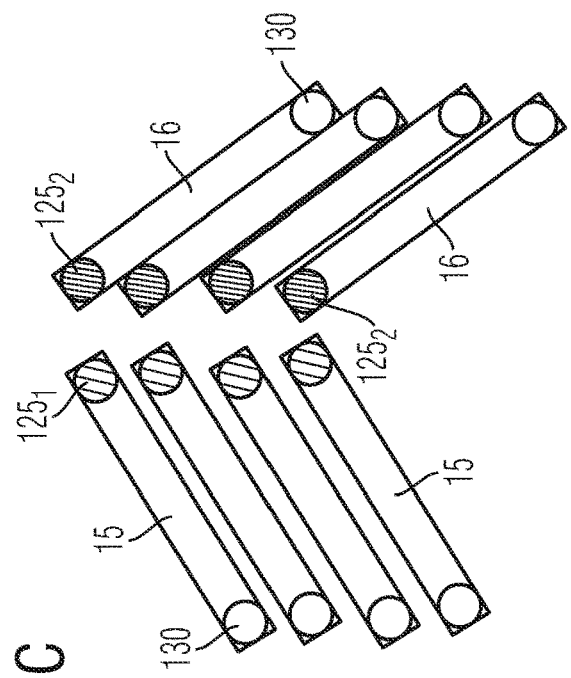
FIGS. 4A to 4D show further configurations of laser devices according to embodiments.
Figure 4D:
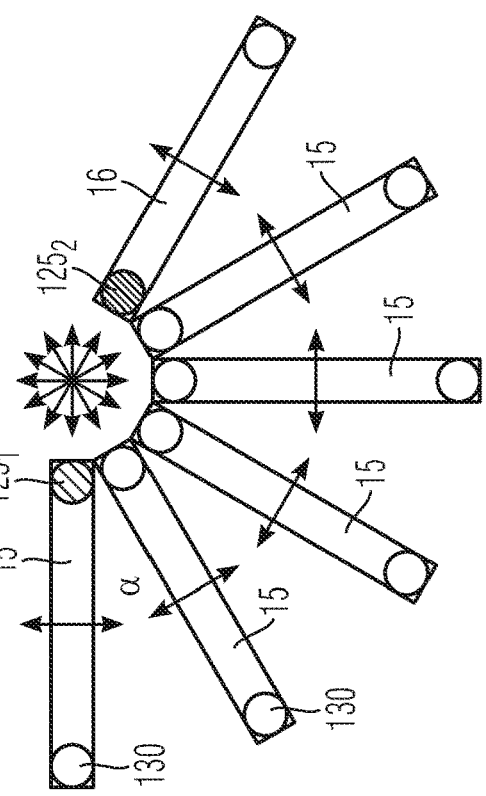
Figure 4A:
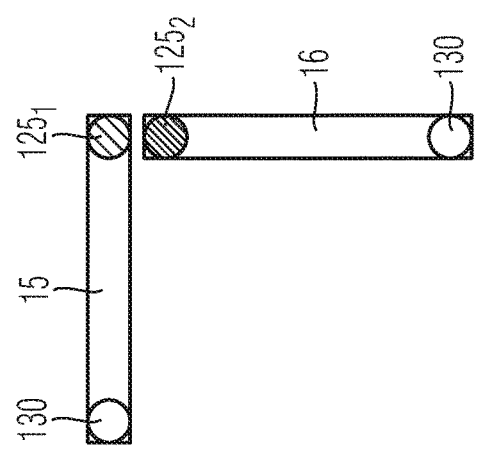
Figure 4B:
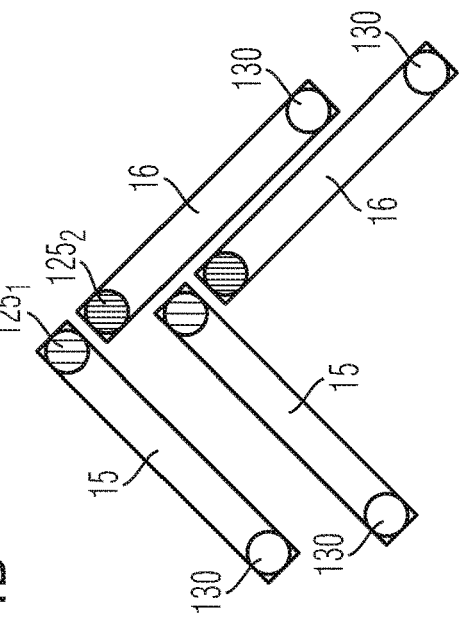

FIGS. 4A to 4C show possible arrangements of laser devices 15, 16. For example, the first laser device 16 may be rotated by 90° with respect to the laser devices 15. As a result, the polarization direction of the emitted electromagnetic radiation may be rotated by 90°. As a consequence, speckles may be suppressed, even without changing the emission wavelength of the laser devices. Accordingly, the arrangements shown in FIGS. 4A to 4C may be combined with a configuration in which the first cavity mirrors $125_1$, $125_2$ of the laser devices 15 and the first laser device 16 or the wavelength dependent reflectivities of the cavity mirrors are identical.

FIG. 4D shows a configuration, in which laser devices 15 having different first cavity mirrors 125 are rotated by a small angle, e.g. α which may be smaller than 90°. Due to the different first cavity mirrors 125, the wavelengths are slightly detuned so that the formation of speckles is suppressed. Further due to the rotated arrangement of the laser devices, interference effects are further suppressed.

The concepts discussed in the foregoing may as well be applied to edge emitting lasers.

Figure 5A:
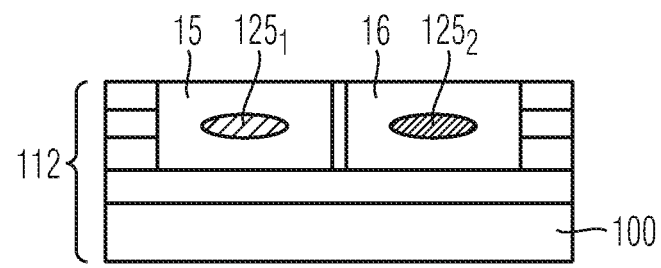
FIG. 5A shows a side view of an optoelectronic semiconductor device according to further embodiments.

FIG. 5A shows a case in which the generated electromagnetic radiation is emitted via a sidewall of the epitaxial layer stack 112 that is, e.g. illustrated in FIGS. 2A and 2B. In a corresponding manner as has been discussed above, the first cavity mirror 125 of an edge emitting laser may be modified so as to have a wavelength dependent reflectivity, wherein the dependence of the reflectivity on the wavelength for the laser device 15 is different from the dependence of the reflectivity on the wavelength for the first laser device 16. For example, the first cavity mirror 125 may be the outcoupling mirror and, thus, may have a lower reflectivity than the second cavity mirror. Alternatively, the first cavity mirror 125 may have a larger reflectivity than the second cavity mirror 130. In this case, the second cavity mirror 130 may act as the outcoupling mirror.

Figure 5B:
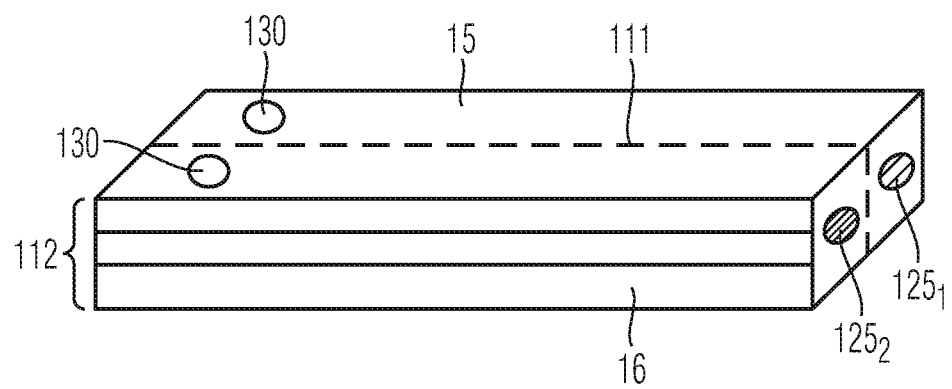
FIG. 5B shows a perspective view of an optoelectronic semiconductor device according to further embodiments.

FIG. 5B shows a further configuration in which the second cavity mirror 130 is arranged over a first main surface 111 of the semiconductor layer stack 112. Also in this configuration, the first cavity mirror $125_1$, $125_2$ may have a reflectivity that depends on the wavelength. Further, the wavelength dependence of the reflectivity for the two cavity mirrors $125_1$, $125_2$ may be different from each other, so that the emission wavelength of the first laser device 16 is slightly detuned from the emission wavelength of further laser devices 15.

As has been discussed above, by locally changing the composition and thickness of the layers of the first cavity mirror, the dependence of the reflectivity on the wavelength may be changed. For example, this change may be very small in order to provide a difference of wavelengths that is lower than 20 nm.

Generally, for deposition apparatuses such as sputtering apparatuses large efforts are taken to provide a uniform layer thickness. According to embodiments, the reflectivity vs. wavelength may be changed over a wafer or a plurality of devices by providing a non-uniform layer thickness when processing a wafer comprising a plurality of laser devices.

FIG. 6A illustrates a sputtering apparatus as an example of a deposition apparatus 17 that may be used for forming by way of example, layers of a first and optionally a second cavity mirror. The sputtering apparatus comprises a source 170 including a process gas 171 that may e.g. be argon. A radio frequency field is generated within the process chamber whereby a plasma is formed. Additionally a voltage is applied between the cathode 173 and the anode 174. For example, the cathode 173 may be a grid cathode. The process gas 171 is ionized due to the plasma. The ions of the process gas are accelerated towards a target 175. The target 175 includes the material of the cavity mirrors such as AlO/Al, tantal or silicon. When the target 175 is bombarded by ions of the process gas 171, particles of the target 175 are ejected and finally are sputtered onto the specimen 176. By adjusting any of the plasma parameters, the parameters of the cathode 173, the angle α between a normal to the cathode 173 and the target 175 and the angle β between the specimen 176 and the target 175 a uniformity of the sputtered layer thickness may be changed.

FIG. 6B shows a specimen 176 having a uniform thickness of a sputtered coating 177.

Figure 6C:
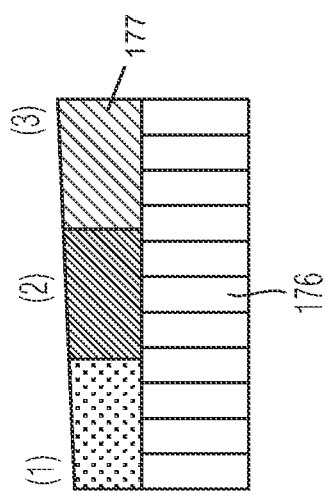
FIG. 6C shows a view of a wafer comprising a plurality of laser devices according to embodiments.

As is further illustrated in FIG. 6C, by changing the parameters or angles mentioned above, the layer thickness may locally vary. FIG. 6C shows a specimen 176 having a coating 177 the thickness of which continuously increases from a left portion to a right portion of the specimen 176. The specimen 176 may, for example, be a laser bar or a lot of cavity mirrors. When the thickness of the coating 177 continuously increases, also a wavelength dependent reflectivity of a cavity mirror including the coating 177 continuously changes over the specimen 176.

Figure 6D:
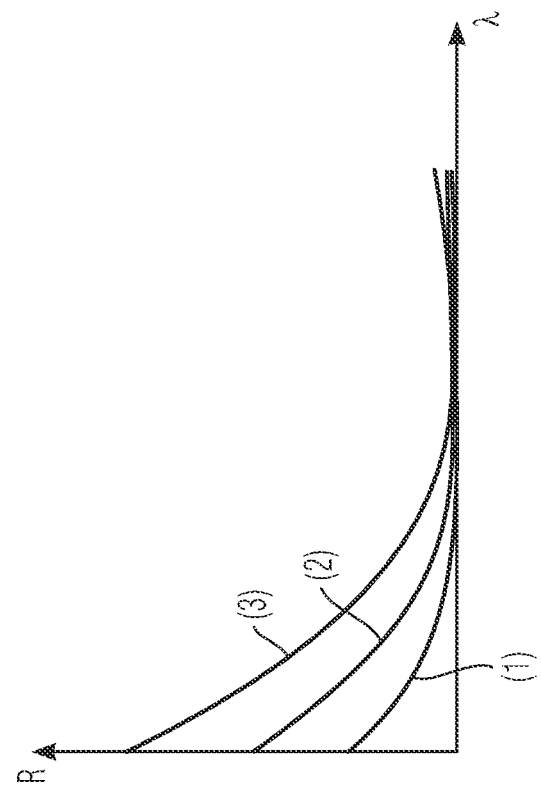
FIG. 6D shows the reflectivity of a cavity mirror in dependence of the wavelength.

FIG. 6D shows the dependence of the reflectivity of a cavity mirrors for three different regions (1), (2) and (3) shown in FIG. 6C. As is illustrated, in region (1) the reflectivity changes to a lower degree with the wavelength than in regions (2) or (3). Accordingly, the emission wavelength of a laser device such as e.g. illustrated in FIGS. 2A and 2B is different for laser devices in regions (1), (2), and (3) of the specimen 176 illustrated in FIG. 6C.

While previous embodiments particularly referred to laser devices having an optical resonator that extends in a horizontal direction, further embodiments may also refer to laser devices in which the optical resonator 131 extends in a vertical direction.

Figure 7A:
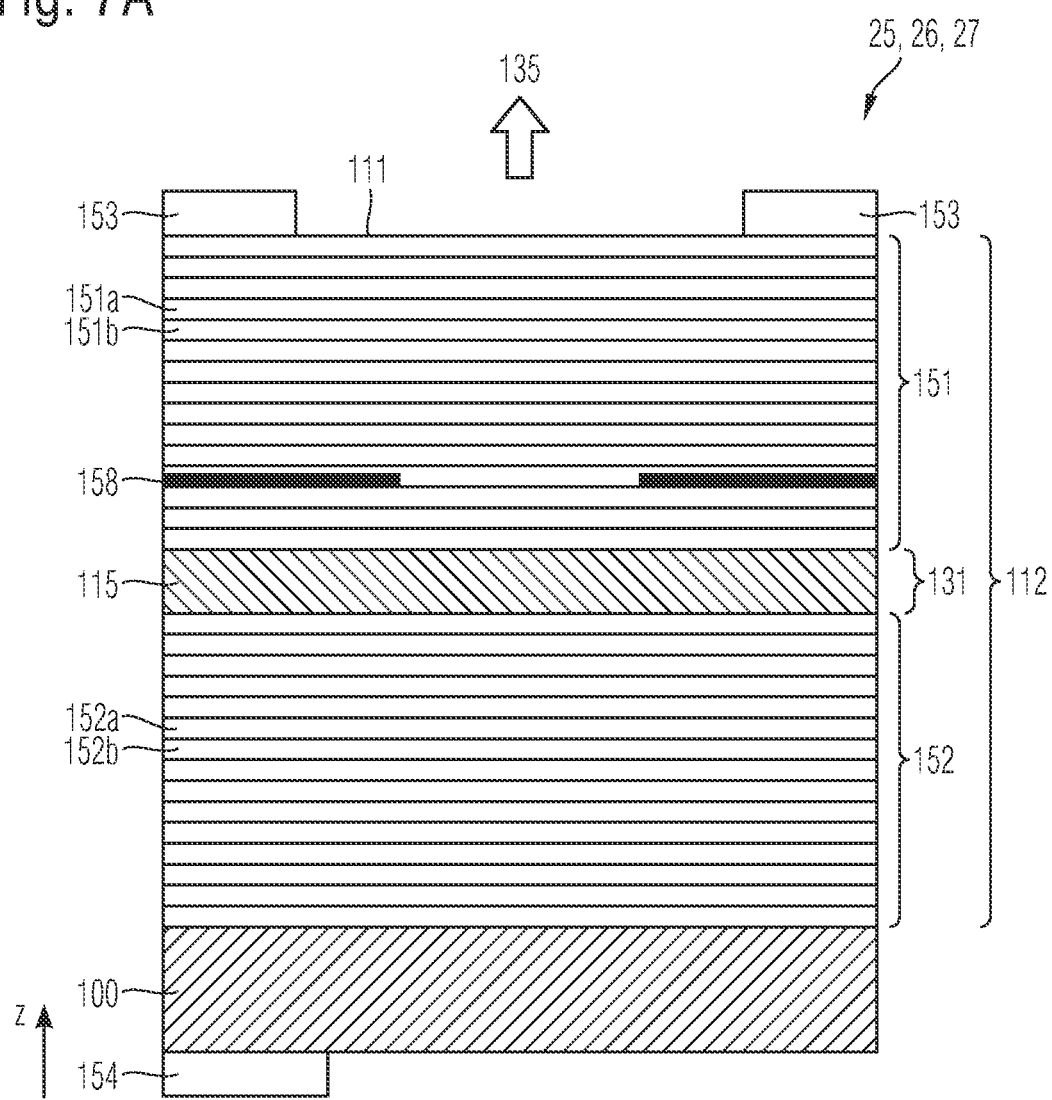
FIG. 7A shows a cross-sectional view of a vertical cavity surface emitting laser that may be a component of the optoelectronic semiconductor device according to further embodiments.

FIG. 7A shows a schematic cross-sectional view of a VCSEL ("Vertical Cavity Surface Emitting Laser") that may implement a vertical laser device 25, a first vertical laser device 26 or a second vertical laser device 27 according to embodiments. The vertical laser device 25, 26, 27 comprises a first cavity mirror 151 and a second cavity mirror 152. The first cavity mirror 151 and the second cavity mirror 152 may be formed as Bragg mirrors. According to embodiments, the first and the second cavity mirrors 151, 152 may comprise semiconductor layers. According to further embodiments, the first cavity mirror 151 and optionally the second cavity mirror 152 may comprise dielectric layers. The composition and characteristics of the first and second cavity mirrors 151, 152 implemented as Bragg mirrors have been discussed herein before. The first cavity mirror 151 may comprise e.g. first and second layers 151a, 151b, having different refractive indices and being alternately stacked. Similarly, the second cavity mirror 152 may comprise first layers and second layers 152a, 152b having different refractive indices and being alternately stacked.

In case any of the cavity mirrors 151, 152 is composed of dielectric layers only, the semiconductor layer stack 112 further comprises a first semiconductor layer of a first conductivity type e.g. p-type that may be arranged adjacent to the active zone 115. In case the second cavity mirror 152 is formed of dielectric layers only, the semiconductor layer stack 112 further comprises a second semiconductor layer of a second conductivity type that is formed in contact with the active zone 115. The vertical laser device 25, 26 further comprises a first contact element 153 and a second contact element 154 for applying a voltage to the laser element.

FIG. 7A further shows an aperture 158 that may comprise an insulating material or a material having reduced conductivity. As a result, the current flow and consequently carrier injection is confined to the semiconductor material between the elements of the aperture 158. As a result, the emitted electromagnetic radiation 135 is shaped.

The active zone 115 may have a similar composition as the active zone 115 that has been discussed with reference to FIGS. 2A and 2B. The VCSEL may be a longitudinally single mode laser in which the emission wavelength is determined by the length of the optical resonator 131. The term "longitudinally" refers to an extension direction of the optical resonator 131.

FIG. 7B shows a schematic cross-sectional view of an optoelectronic semiconductor device 10 in which three laser devices 25, 26 are arranged horizontally adjacent. Each of the laser devices 25, 26 is configured to emit electromagnetic radiation 135 via a first main surface 111 of a semiconductor layer stack 112. FIG. 7B further illustrates a diffusor 155 and a lid 156 with which the vertical laser device 25 is usually packaged. The diffusor 155 and the lid 156 are used for eye safety monitoring and a correct expansion of the field of view 168. For example, the diffusor 155 may arranged in contact with the semiconductor layer stack 112 and may package the VCSEL. The lid 156 may be arranged over an array of VCSELs.

According to embodiments illustrated in FIG. 7B, the first laser device 26 is configured to emit electromagnetic radiation 135 having a polarization state that is different from the polarization state of adjacent laser devices 25.

Figure 7C:
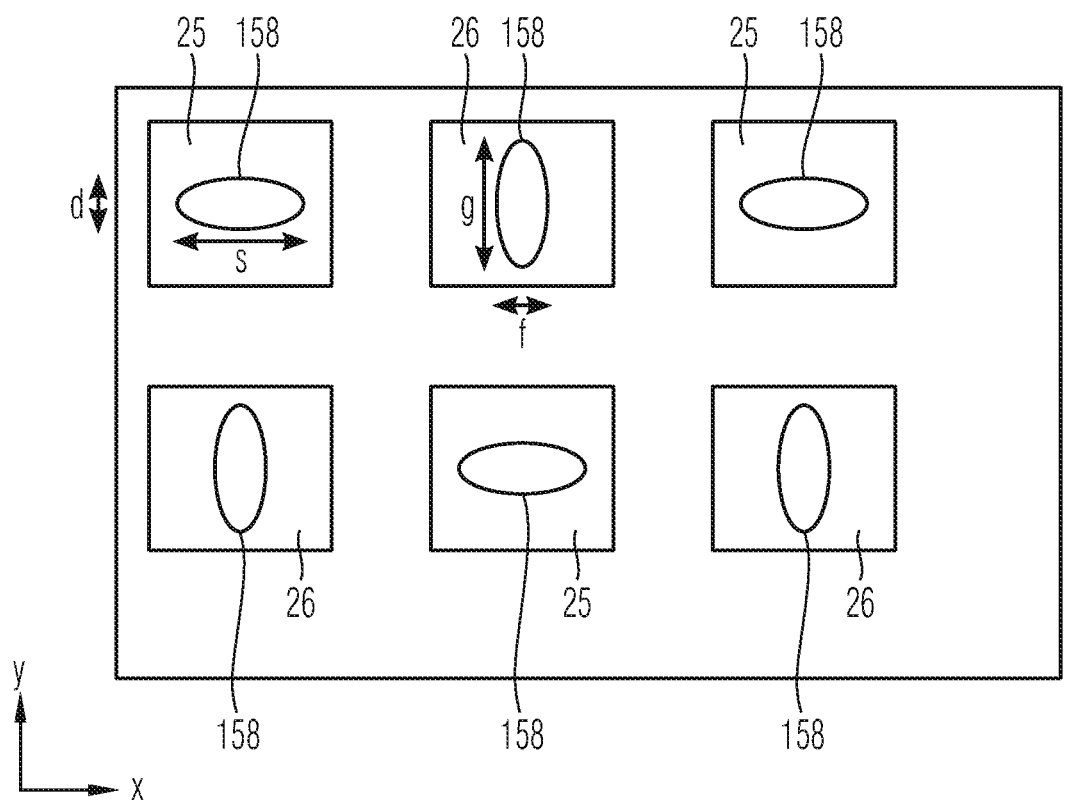
FIG. 7C shows a horizontal cross-sectional view of an optoelectronic semiconductor device according to embodiments.

FIG. 7C shows an example of a horizontal cross-sectional view of the optoelectronic semiconductor device 10 illustrated in FIG. 7B. As is shown, the optoelectronic semiconductor device comprises a plurality of laser devices 25, 26. FIG. 7C further shows the shape of the aperture 158. As is indicated in FIG. 7C, the aperture has different extension lengths in two vertical horizontal directions. For example, in the laser device 25, the extension length s in the x-direction is larger than the extension length d in the y direction.

As is illustrated, the first laser devices 26 are rotated by 90° with respect to the further laser devices 25. This can be recognized by a different orientation of the aperture elements 158. In more detail, in the first laser device 26, the extension length f in the x-direction corresponds to d and is smaller than the extension length g in the y-direction. As a result, the polarization direction of electromagnetic radiation emitted by the first laser device 26 is rotated by 90° with respect to the polarization direction of electromagnetic radiaten emitted by the laser device 25. As a result, the formation of speckles is suppressed.

FIG. 8A shows an embodiment of an optoelectronic semiconductor device, in which each of the laser devices further comprises a waveplate. For example, the waveplate may be a quarter waveplate that may convert—when properly arranged—linearly polarized light into elliptically polarized light and vice versa. For example, depending on the orientation, right hand circularly or left hand circularly polarized light may be generated. In the configuration of FIG. 8A, the laser device 25 has a waveplate 159, the first laser device 26 has a first waveplate 160 and the second laser device 27 has a second waveplate 161. The waveplates are rotated e.g. by 0, 30 and 60°, for example. Due to the presence of the waveplates having a different angle of rotation, the polarization state of the light emitted by any of the laser devices may be changed. Accordingly, the array shown in FIG. 8A comprises three laser devices 25, 26, 27 emitting light having different polarization states. As a result, speckles may be further reduced.

FIG. 8B shows an embodiment wherein the differently oriented waveplates 159, 160, 161 are combined with differently orientated laser devices, as is indicated by the orientation of the apertures 158 in the lower portion of FIG. 8B. As a result, speckles may be further reduced.

Figure 9A:
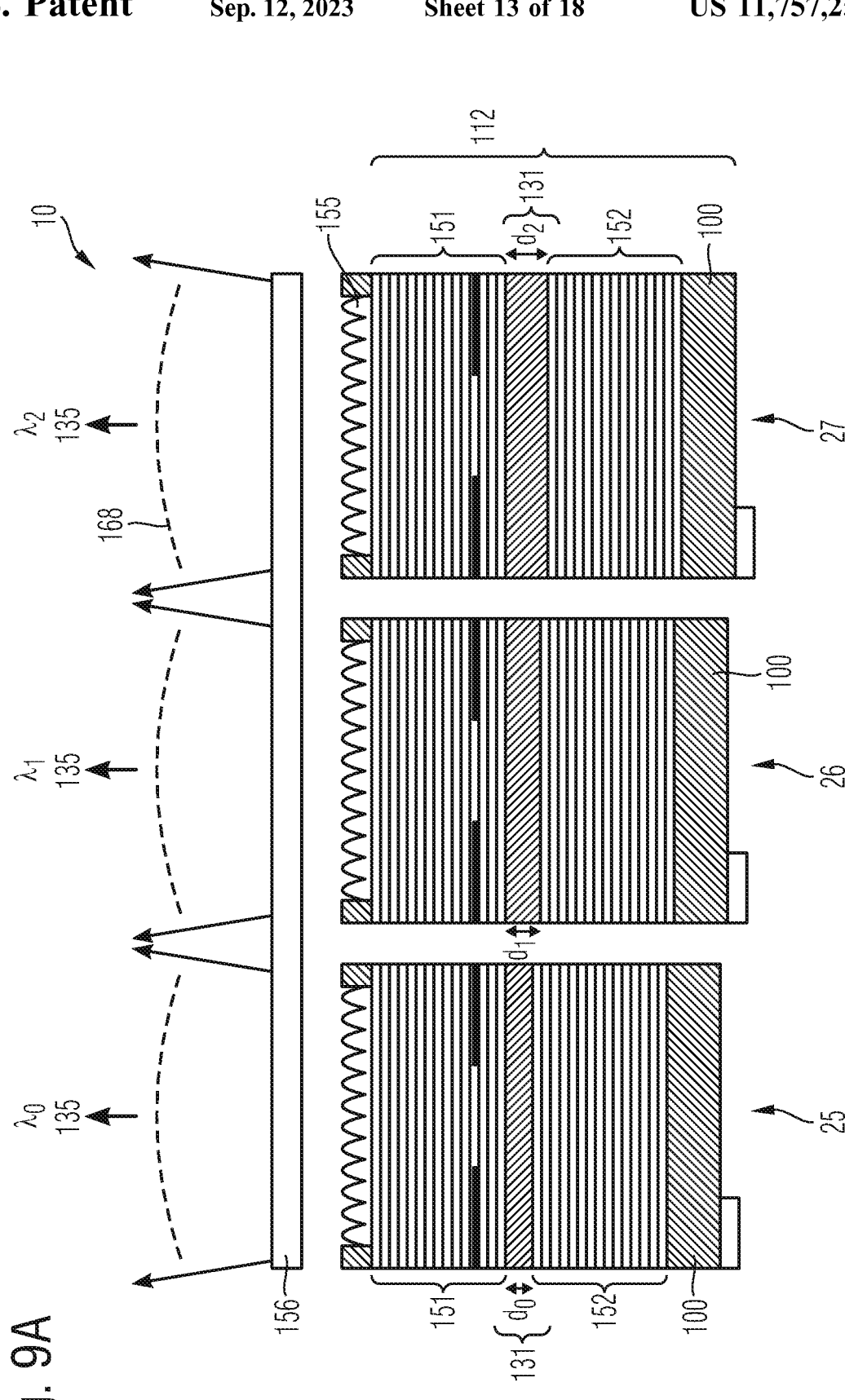

FIG. 9A shows an arrangement of a vertical laser device 25, a first vertical laser device 26 and, optionally, a second vertical laser device 27. In this embodiment, the first vertical laser device emits electromagnetic radiation 135 at an emission wavelength $\lambda_1$ and the second vertical laser device 27 emits electromagnetic radiation 135 at an emission wavelength $\lambda_2$. The emission wavelength $\lambda_2$ of the second vertical laser device 27 may be different from the first emission wavelength $\lambda_1$ of the first vertical laser device and the emission wavelength $\lambda_0$ of a further vertical laser device 25 of the plurality of laser devices.

The variation of wavelengths may be achieved by varying a length d of the optical resonator 131. According to embodiments, a variation of the length of the optical resonator may be caused by a process-induced thickness variation of one or more layers of the active zone 115. For example, when using the deposition apparatus 17 shown in FIG. 6A, by appropriately modifying the process parameters and/or the angles discussed above with reference to FIG. 6A, a variation of layer thicknesses may be achieved over a specimen. For example, if the specimen is a wafer in which a plurality of vertical laser devices are processed simultaneously, a variation of layer thickness depending on position within the wafer may be achieved. As a result a local variation of the resonator length 131 and hence the emission wavelength may be achieved. As illustrated in FIG. 9A, the optical resonator 131 of the first vertical laser device 26 has a first length $d_1$ which is different from the length $d_0$ of the optical resonator 131 of a further vertical laser device 25. Optionally, the optical resonator 131 of the second vertical laser device 27 has a second length $d_2$ which is different from the length $d_0$ of the optical resonator 131 of the further vertical laser device 25 and which is different from the first length $d_1$.

For example, the variation of wavelengths may be 7 to 10 nm to effectively prevent coherence interaction and thus suppressing speckles. In case the laser device is to be used in combination with a notch filter, the variation of the wavelength should be adapted to the characteristic of the notch filter.

FIG. 9B shows an optoelectronic semiconductor device according to further embodiments, comprising laser devices 25, a first laser device 26, and optionally, a second laser device 27. The first laser device 26 is configured to emit electromagnetic radiation having a first wavelength $\lambda_2$ which is different from the wavelength $\lambda_0$ of the further laser device 25. The second wavelength $\lambda_2$ of the second laser device 27 is different from the first wavelength $\lambda_1$ and further from the wavelength of the laser devices 25. According to embodiments, the laser devices 25, 26, 27 may further be rotated with respect to each other so that the polarization direction of the emitted light may be different. In particular, the first laser device 26 is rotated by 90° with respect to the laser device 25. Moreover, the laser devices may comprise different waveplates 159, 160, 161 as has been discussed with reference to FIGS. 8A and 8B.

FIG. 10 shows a schematic cross-sectional view of an optoelectronic semiconductor device 10 comprising laser devices 25, a first laser device 26 and, optionally, a second laser device 27. At least some of the laser devices comprises a birefringent plate. For example, each of the laser devices may comprise a birefringent plate that may be changed among the different laser devices. For example, the first birefringent plate 148 of the first vertical layer device 26 may be rotated with respect to the further birefringent plate 147 of the vertical laser device 25. Further, the second birefringent plate 149 of the second laser device 27 may be rotated with respect to the first birefringent plate 148 and the further birefringent plate 147.

According to further embodiments, the birefringent plates 147, 148, 149 may have different thicknesses. According to embodiments, different thicknesses of the birefringent plates 147, 148, 149 may be caused by a process-induced thickness variation. For example, when using the deposition apparatus 17 shown in FIG. 6A, by appropriately modifying the process parameters and/or the angles discussed above with reference to FIG. 6A, a variation of layer thicknesses may be achieved over a specimen. For example, if the specimen is a wafer in which a plurality of vertical laser devices are processed simultaneously, a variation of layer thickness depending on position within the wafer may be achieved. As a result, a local variation of the thickness of the birefringent plate 147, 148, 149 may be achieved. As a further result, different polarization states of the emitted electromagnetic radiation may be achieved for the laser devices 25, the first laser device 26 and, optionally, the second laser device 27.

According to further embodiments, the first laser device may be configured to emit electromagnetic radiation having a first intensity distribution that is different from the intensity distribution of a further laser device of the plurality of laser devices.

FIG. 11A shows a cross-sectional view of an optoelectronic semiconductor device according to further embodiments. According to embodiments, an intensity shaping element 162, 163, 264 may be different for the laser device 25, the first laser device 26 and the second laser device 27. For example, some of the intensity shaping elements 162, 163, 164 may be implemented as so-called "batwing diffusers" that direct more energy toward wide angles compared to a central portion. As a consequence, hot spots may be eliminated. Hot spots in the image prevent uniform illumination. By using these intensity shaping elements, a more uniform illumination may be achieved.

FIG. 11B shows an embodiment, in which the intensity shaping element may be implemented by a microlens array. Accordingly, the first laser device 26 comprises a first microlens array 164, and, optionally, the second laser device 27 may comprise a second microlens array 167. The first microlens array 166 may be different from the second microlens array 167. Further, the first and the second microlens arrays 166, 167 may be different from the microlens array 165 of the laser device 25. According to further embodiments, these embodiments may be combined with the elements discussed before, e.g. the polarization state modifying elements and the wavelength modifying elements. For example, the microlens arrays may be adapted to expand the field of view 168.

Figure 12A:
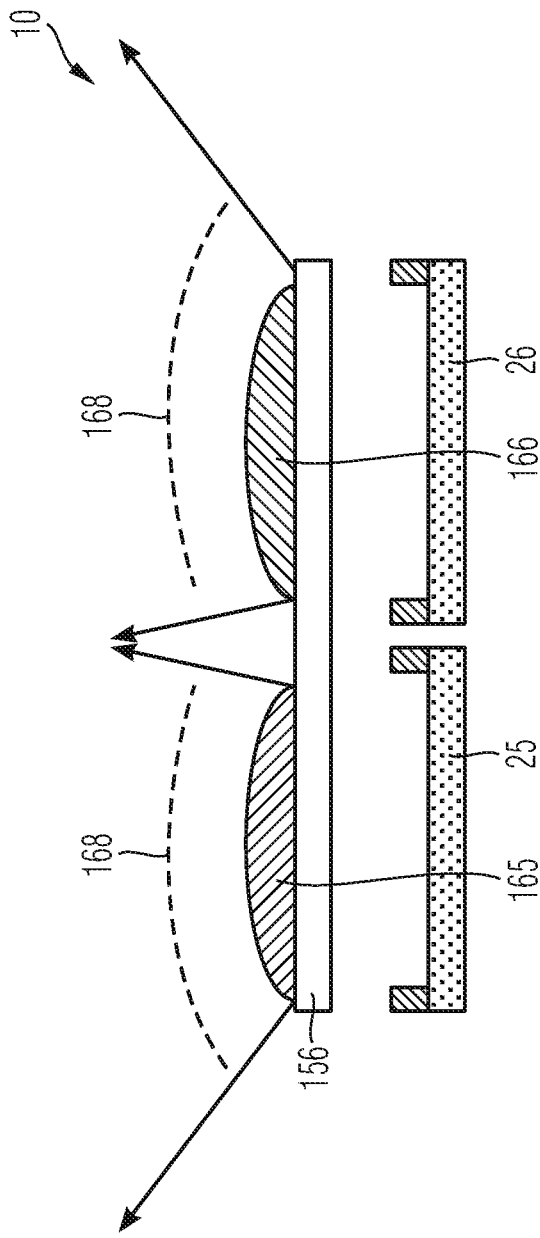
FIGS. 12A and 12B show vertical cross-sectional views of optoelectronic semiconductor devices according to further embodiments.
Figure 12B:
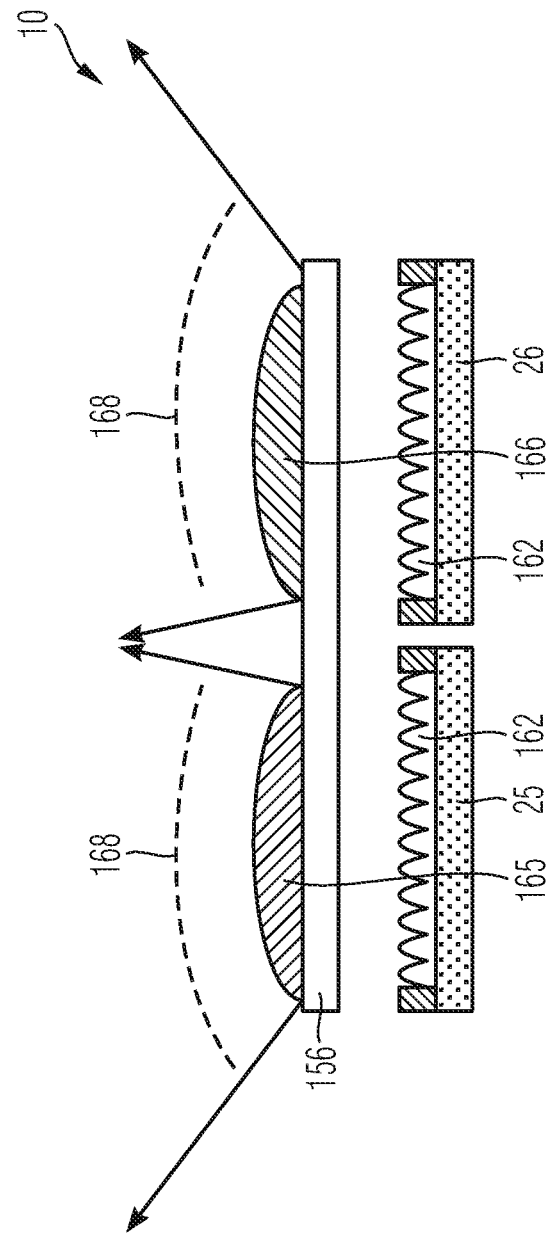

This is illustrated in FIG. 12A wherein the microlens array 165 and the first microlens array 166 are configured to expand the field of view. For example, the microlens arrays 165, 166 may be implemented as gradient-index microlens arrays. Moreover, these embodiments may be combined with a special sensitivity shaping element, such as a diffusor e.g. a batwing diffusor. As is illustrated, due to these measures the field of view 168 may be largely expanded, e.g to 150°. Further, the combination of gradient microlens array and batwing profile allows for a wide, controlled, uniformly lit imaging plane.

These embodiments may be further combined with the elements discussed herein before, e.g. the waveplates, the further polarization state changing elements and the measures to vary the wavelength of the laser devices. As a consequence, speckles may be prevented or reduced.

Figure 13A:
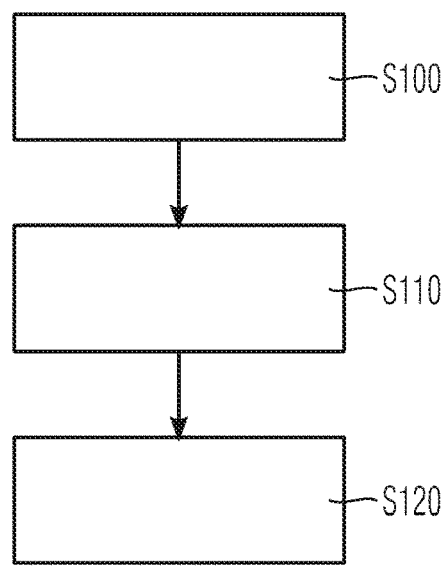
FIGS. 13A and 13B summarize methods according to embodiments.

FIG. 13A summarizes a method of manufacturing an optoelectronic semiconductor device according to embodiments. As is shown, the method comprises forming (S100) a layer stack comprising a plurality of semiconductor layers for forming a plurality of laser devices being horizontally arranged, forming a first cavity mirror (S110), and forming a second cavity mirror (S120). An optical resonator is arranged between the first cavity mirror and the second cavity mirror, the optical resonator comprising an active zone. According to embodiments, a layer of the first cavity mirror of the first laser device is formed to have a thickness that is different from a thickness of a layer of the first cavity mirror of the further laser device. According to embodiments, the first cavity mirror may be formed before forming the second cavity mirror or vice versa.

According to embodiments, each of the plurality of laser devices is a vertical cavity surface emitting laser. A length of an optical resonator of the first laser device is formed to be different from the length of the optical resonator of the further laser device.

According to embodiments, a plurality of laser devices that are horizontally arranged are formed of a single epitaxial layer stack. By slightly varying the layer thickness over laser devices formed from a single wafer, the wavelength-dependent reflectivity may be achieved. As a result the plurality of laser devices emit electromagnetic radiation having different wavelength, the difference of the wavelengths being less than 20 nm.

Alternatively, if the laser devices are implemented as vertical cavity surface emitting laser devices, the length of the optical resonators may be slightly varied among the different vertical laser devices formed from a single wafer. As a result, the plurality of vertical cavity surface emitting laser devices emit electromagnetic radiation having different wavelength, the difference of the wavelengths being less than 20 nm.

Figure 13B:
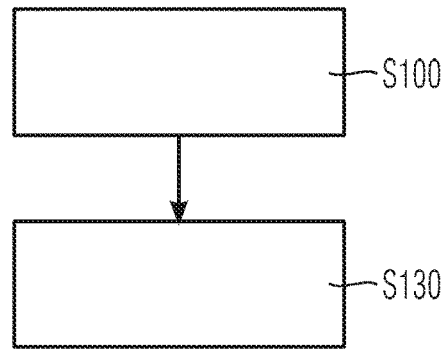

As is illustrated in FIG. 13B, a method of manufacturing a semiconductor device comprises forming (S100) a layer stack comprising a plurality of semiconductor layers for forming a plurality of vertical cavity surface emitting laser devices being horizontally arranged. The method further comprises forming (S130) a birefringent plate over the plurality of vertical cavity surface emitting laser devices. A thickness of the birefringent plate over a first vertical cavity surface emitting laser device is different from the thickness of the birefringent plate over a further laser device of the vertical cavity surface emitting laser devices.

As a result, an optoelectronic semiconductor device may be manufactured, wherein a polarization state of the plurality of laser devices, that are formed of a single wafer, is varied for the plurality of laser devices.

As a result of the measures discussed above, speckles may be avoided or reduced.

Figure 14A:
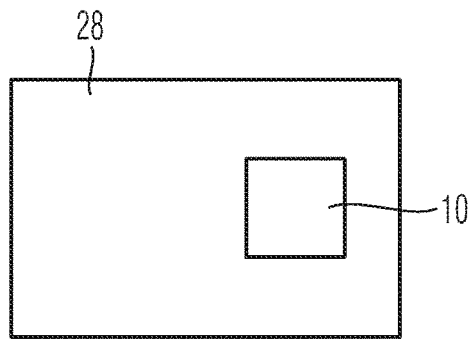
FIG. 14A shows an illumination device according to embodiments.

FIG. 14A illustrates an illumination or imaging device 28 that comprises the optoelectronic semiconductor device 10 as explained above. For example, the illumination device 28 may be used for pumping high power laser devices, e.g. using an array of fibers or coupling optics for coupling of all the emitters to a single fiber. According to further embodiments, the illumination device 28 may be used in automotive or display applications.

Figure 14B:
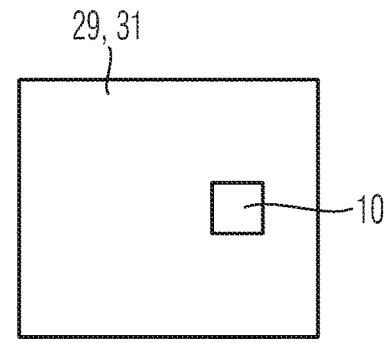
FIG. 14B shows a projection device or an augmented reality device according to embodiments.

FIG. 14B illustrates a projection device 29 or an augmented reality device 31 comprising the optoelectronic semiconductor device 10 as explained above. In these applications, since the generation of speckles is reduced, also the generation of artefacts is reduced.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. An optoelectronic semiconductor device comprising:
a semiconductor layer stack comprising a plurality of semiconductor layers arranged in a vertical direction;
a plurality of semiconductor laser devices, each of the laser devices being configured to emit electromagnetic radiation via a sidewall of the semiconductor layer stack, the laser devices being horizontally arranged, so that the laser devices are formed from common semiconductor layers of the semiconductor layer stack;
wherein each of the laser devices comprises:
a first cavity mirror,
a second cavity mirror, and
an optical resonator being arranged between the first cavity mirror and the second cavity mirror, the optical resonator comprising an active zone,
wherein a first laser device of the plurality of laser devices is configured to emit electromagnetic radiation having a first wavelength different from a wavelength of a further laser device of the plurality of laser devices,
wherein the first cavity mirror of the first laser device and the first cavity mirror of the further laser device have a reflectivity that depends on the wavelength, and a wavelength-dependence of the reflectivity of the first cavity mirror of the first laser device is different from the wavelength dependence of the reflectivity of the first cavity mirror of the further laser device.

2. The optoelectronic semiconductor device according to claim 1, wherein the optical resonator of each of the plurality of laser devices extends in a horizontal direction.

3. The optoelectronic semiconductor device according to claim 2, wherein each of the plurality of laser devices comprises two or more laser elements that are vertically stacked.

4. An optoelectronic semiconductor device comprising:
a semiconductor layer stack comprising a plurality of semiconductor layers arranged in a vertical direction;
a semiconductor chip comprising an array of laser devices, each of the laser devices being configured to emit electromagnetic radiation via a sidewall of the semiconductor layer stack, the laser devices being horizontally arranged,
each of the laser devices comprising a first cavity mirror, a second cavity mirror and an optical resonator between the first cavity mirror and the second cavity mirror, an active zone for generating the electromagnetic radiation being arranged in the optical resonator,
wherein the first cavity mirrors of each of the laser devices are different from each other, and
wherein the first cavity mirrors of each of the laser devices have a different wavelength-dependent reflectivity.

5. An illumination device comprising the optoelectronic semiconductor device of claim 1.

6. A projection device or an augmented reality device comprising the optoelectronic semiconductor device of claim 1.

* * * * *